US006992395B2

(12) United States Patent
    Fukasawa (10) Patent No.: US 6,992,395 B2
(45) Date of Patent: Jan. 31, 2006

(54) SEMICONDUCTOR DEVICE AND SEMICONDUCTOR MODULE HAVING EXTERNAL ELECTRODES ON AN OUTER PERIPHERY

(75) Inventor: Hiroyuki Fukasawa, Tokyo (JP)

(73) Assignee: Sony Corporation, Tokyo (JP)

( * ) Notice: Subject to any disclaimer, the term of this patent is extended or adjusted under 35 U.S.C. 154(b) by 2 days.

(21) Appl. No.: 10/363,049

(22) PCT Filed: Jun. 12, 2002

(86) PCT No.: PCT/JP02/05853

§ 371 (c)(1),
(2), (4) Date: Feb. 28, 2003

(87) PCT Pub. No.: WO03/005445

PCT Pub. Date: Jan. 16, 2003

(65) Prior Publication Data

US 2003/0183930 A1    Oct. 2, 2003

(30) Foreign Application Priority Data

Jul. 4, 2001    (JP)    ............................. 2001-203077

(51) Int. Cl.
    *H01L 23/48*    (2006.01)
    *H01L 23/34*    (2006.01)

(52) U.S. Cl. ...................... 257/777; 257/723; 257/686; 257/685; 257/784; 257/786; 257/698; 257/734

(58) Field of Classification Search ................ 257/777, 257/778, 723, 686, 685, 698, 784, 786, 787, 257/738, 734, 737
    See application file for complete search history.

(56) References Cited

U.S. PATENT DOCUMENTS

| 5,216,278 A | * | 6/1993 | Lin et al. ..................... 257/688 |
| 5,222,014 A | * | 6/1993 | Lin ............................. 361/792 |
| 5,594,275 A | * | 1/1997 | Kwon et al. ................ 257/686 |
| 5,608,265 A | * | 3/1997 | Kitano et al. ............... 257/738 |
| 5,861,666 A | * | 1/1999 | Bellaar ....................... 257/686 |

(Continued)

FOREIGN PATENT DOCUMENTS

| JP | 64-18752 A1 | 1/1989 |
| JP | 11-33-306 | * 11/1990 |
| JP | 4-133346 A1 | 5/1992 |
| JP | 11-330306 A1 | 11/1999 |
| KR | 2001063236 A | * 7/2001 |

OTHER PUBLICATIONS

International Search Report dated Jul. 4, 2001.

*Primary Examiner*—Alexander Oscar Williams
(74) *Attorney, Agent, or Firm*—Rader, Fishman & Grauer PLLC; Ronald P. Kananen (57) ABSTRACT

The present invention is directed to a semiconductor device and a semiconductor module both having an inexpensive and compact structure. The semiconductor module (M1) according to a first embodiment of the present invention is comprised of a plurality of semiconductor devices (A1) through (A3) having a structure that includes external connection electrodes (15) and (16) being provided on both the face side and the back side of outer peripheral portions of a printed wiring board (10), and a semiconductor integrated circuit chip (1A) being mounted on a central portion of the printed wiring board (10). The external connection electrodes (15) of the semiconductor devices (A1) and (A3) and the external connection electrodes (16) of the semiconductor device (A2) are electrically connected to each other by solder Sb, for example, either directly or through a chip part (30) or a relay board (40).

3 Claims, 6 Drawing Sheets

U.S. PATENT DOCUMENTS

| | | | |
|---|---|---|---|
| 6,051,878 A * | 4/2000 | Akram et al. | 257/686 |
| 6,051,887 A * | 4/2000 | Hubbard | 257/777 |
| 6,093,969 A * | 7/2000 | Lin | 257/777 |
| 6,188,127 B1 * | 2/2001 | Senba et al. | 257/686 |
| 6,373,447 B1 * | 4/2002 | Rostoker et al. | 343/895 |
| 6,392,292 B1 * | 5/2002 | Morishita | 257/686 |
| 6,492,718 B2 * | 12/2002 | Ohmori | 257/686 |
| 6,522,022 B2 * | 2/2003 | Murayama | 257/786 |
| 6,545,367 B2 * | 4/2003 | Sota | 257/784 |
| 6,608,371 B2 * | 8/2003 | Kurashima et al. | 257/686 |
| 6,704,964 B2 * | 3/2004 | Knowles | 15/104.04 |
| 6,731,013 B2 * | 5/2004 | Juso et al. | 257/779 |
| 6,774,473 B1 * | 8/2004 | Shen | 257/686 |
| 6,838,768 B2 * | 1/2005 | Corisis et al. | 257/738 |
| 2002/0053730 A1 * | 5/2002 | Mashino | 257/690 |
| 2002/0074630 A1 * | 6/2002 | Ando et al. | 257/666 |
| 2004/0115863 A1 * | 6/2004 | Oyama | 438/106 |

* cited by examiner

SEMICONDUCTOR DEVICE AND SEMICONDUCTOR MODULE HAVING EXTERNAL ELECTRODES ON AN OUTER PERIPHERY

TECHNICAL FIELD

The present invention relates to the structures and constitutions of a semiconductor device and a semiconductor module in which a plurality of semiconductor devices are incorporated.

BACKGROUND ART

First, referring to FIGS. 10 to 13, the constitutions and structures of a semiconductor device and a semiconductor module according to the related art will be described.

Figure 10:
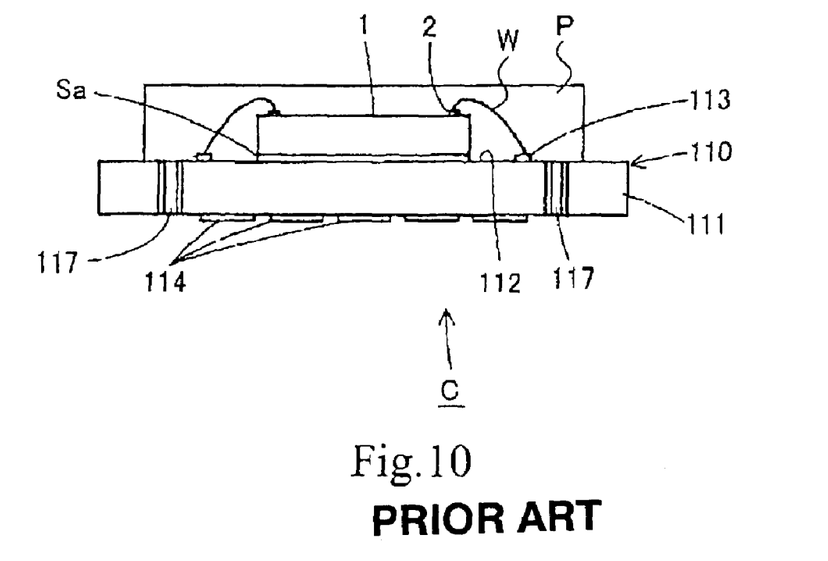
FIG. 10 is a sectional view of a semiconductor device according to one embodiment of the related art.
Figure 11:
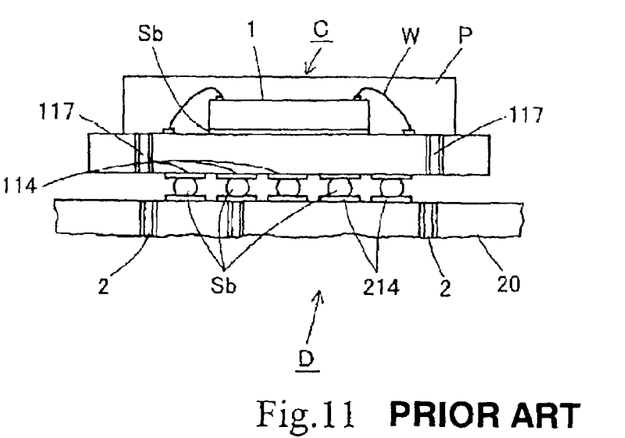
FIG. 11 is a sectional view of the structure in which the semiconductor device shown in FIG. 10 is mounted on a mother board.
Figure 12:
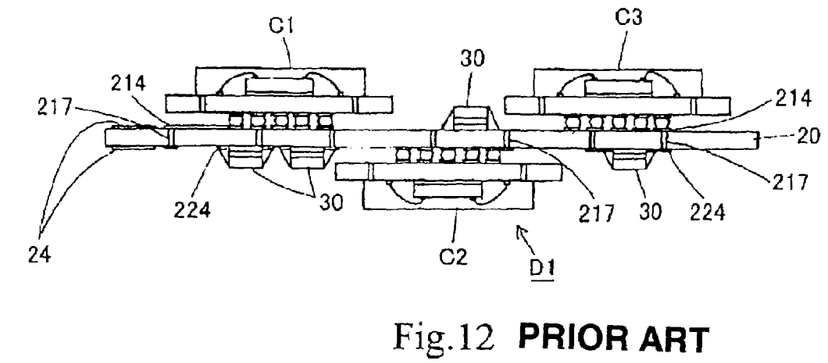
FIG. 12 is a sectional view of a semiconductor module in which a plurality of semiconductor devices shown in FIG. 10 are mounted on a mother board.
Figure 13:
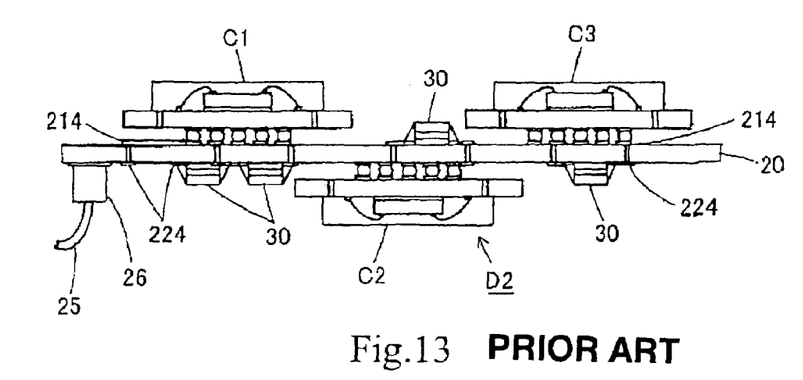
FIG. 13 is a sectional view of a semiconductor module according to another embodiment in which a plurality of semiconductor devices shown in FIG. 10 are mounted on a mother board.

FIG. 10 is a sectional view of a semiconductor device according to one embodiment of the related art, FIG. 11 is a sectional view of the structure in which the semiconductor device shown in FIG. 10 is mounted on a mother board, FIG. 12 is a sectional view of a semiconductor module in which a plurality of semiconductor devices shown in FIG. 10 are mounted on a mother board, and FIG. 13 is a sectional view of a semiconductor module according to another embodiment in which a plurality of semiconductor devices shown in FIG. 10 are mounted on a mother board.

First, the constitution and structure of a semiconductor device according to one embodiment of the related art will be described by use of FIG. 10.

The semiconductor device C is comprised of a semiconductor integrated circuit chip (hereinafter referred to simply as "IC chip") 1 and a printed wiring board 110. On the surface of the IC chip 1, a plurality of bump 2 of gold, solder or the like are provided on the surfaces of electrodes formed in a predetermined arrangement. On the surfaces of an electrically insulating substrate 111 of the printed wiring board 110, a plurality of lands 113 corresponding to the bumps 2 are provided at peripheral portions of a mount portion 112 on the face side for mounting the IC chip 1, while a plurality of external connection electrodes 114 are provided in a peripheral arrangement or a lattice arrangement on the back side, and a plurality of via holes 117 for electrical connection between the lands 113 on the face side and the external connection electrodes 114 on the back side are provided.

The IC chip 1 is mounted on a central portion of the printed wiring board 110 by use of an adhesive Sa or the like, and the individual bumps 2 are electrically connected to the corresponding lands 113 by use of metallic thin wires W of gold or the like. The semiconductor device C has a constitution in which the whole part of the IC chip 1 inclusive of the connection portions between the metallic thin wires W and the lands 113 is sealed with an insulating sealing material P such as an epoxy resin.

Semiconductor modules D, D1 and D2 shown in FIGS. 11 to 13 each have a structure in which a plurality of semiconductor devices C having the above-mentioned structure are mounted on a mother board 20. On the face side of the mother board 20, a plurality of lands 214 are provided at positions corresponding to the external connection electrodes 114, lands 224 (FIG. 12) are provided on the back side, and, if required, via holes 217 communicating to the back side or the like are provided. FIG. 11 shows enlarged the condition where a single IC chip 1 is electrically connected to the lands 214 on the face side of the mother board 20 having the above structure by use of, for example, soldering or other similar method. Symbol Sb denotes solder.

The semiconductor modules D1 and D2 shown in FIGS. 12 and 13 each have a constitution in which two IC chips 1 shown in FIG. 10 are mounted on the lands 214 on the face side of the mother board 20 by a soldering method, while a single IC chip 1 is mounted on the land 224 on the back side of the mother board 20 by a soldering method, and, in addition, a plurality of chip parts 30 such as resistor and capacitor are mounted. The semiconductor module D1 shown in FIG. 12 has a structure in which external connection terminals 24 connected to the lands 214 and 224 and functioning for insertion into and connection with a socket (not shown) of other electric circuit board are provided at one end of the mother board 20. The semiconductor module D2 shown in FIG. 13 has a structure in which a connector 26 or the like connected to the land 224 and functioning for connection to other electric circuit board through a flexible cable wiring board 25 is provided at one end of the mother board 20.

The semiconductor device C and the semiconductor modules D, D1 and D2 having the above-mentioned structures and constitutions are disclosed in U.S. Pat. No. 5,216,278 and ASIC & EDA, March, 1993, pp. 9–15, and are each a known one sealed in the form of "OMPAC" by Motorola, or the like.

However, such structures of the semiconductor device C and the semiconductor modules D, D1 and D2 have the problems that large numbers of printed wiring boards 110 and mother boards 20 must be used, cost is high, and a compact constitution cannot be achieved.

The present invention aims at solving the above-mentioned problems. Accordingly, it is an object of the present invention to provide a semiconductor device and a semiconductor module which can be inexpensively constituted with a compact structure.

DISCLOSURE OF INVENTION

Therefore, a semiconductor device according to the present invention is characterized in that an external connection electrode is provided at an outer peripheral portion of a printed wiring board on which an IC chip is mounted.

The external connection electrode is provided at least on a surface on one of the face side and the back side of the outer peripheral portion of the printed wiring board. In addition, if required, in a certain semiconductor device, the IC chip mounted on a central portion of the printed wiring board provided with the external connection electrode is sealed with a sealing material in a thickness smaller than the thickness of the printed wiring board.

In addition, a semiconductor module according to the present invention is characterized in that a mother board is not used, at least two semiconductor devices having the above-mentioned structure are incorporated, and the external connection electrodes provided on the printed wiring boards of the semiconductor devices are electrically connected to each other.

A certain one of the semiconductor modules may have a constitution in which the external connection electrode provided on the face side of the printed wiring board of one of the adjacent semiconductor devices and the external connection electrode provided on the back side of the printed wiring board of the other of the adjacent semiconductor devices are connected to each other. Another one of the semiconductor modules may have a constitution in which the external connection electrodes provided on the face side or the back side of the printed wiring boards of the adjacent semiconductor devices are connected to each other.

Further, the semiconductor modules may have a structure in which the external connection electrodes of the adjacent semiconductor devices are connected to each other through a chip part or a relay board.

Furthermore, the semiconductor modules may have a structure in which a plurality of semiconductor devices are connected to each-other through the external connection electrodes in a two-dimensional expanse.

Therefore, the semiconductor device according to the present invention makes it possible to assemble a semiconductor module in two-dimensional and three-dimensional expanse, with a simple structure in which an external connection electrode is provided at a peripheral portion of a printed wiring board with an IC chip mounted at a central portion thereof.

Besides, the semiconductor module according to the present invention adopts a structure in which the printed wiring boards of the semiconductor devices are connected to each other directly or through a chip part or a relay board, so that it is unnecessary to use a mother board occupying a large area, and the semiconductor module can be constituted in a compact form and inexpensively.

BRIEF DESCRIPTION OF DRAWINGS

FIGS. 1A to 1C show a printed wiring board according to an embodiment preferable for use in a semiconductor device of the present invention, in which

FIGS. 2A and 2B show a semiconductor device according to a first embodiment of the present invention, in which

FIGS. 8A and 8B show a semiconductor module according to a fifth embodiment of the present invention, in which

BEST MODE FOR CARRYING OUT THE INVENTION

Now, the constitutions and structures of a semiconductor device and a semiconductor module according to an embodiment of the present invention will be described below referring to FIGS. 1A to 9.

Figure 1A:
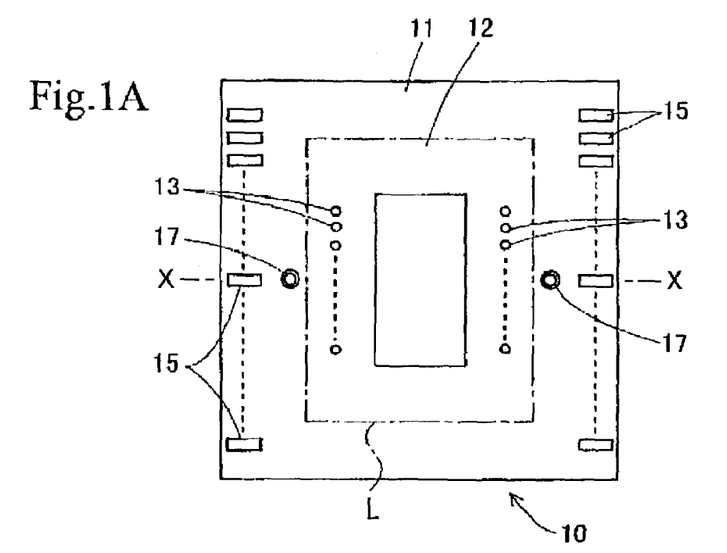
FIG. 1A is a plan view on the face side of the same.
Figure 1B:
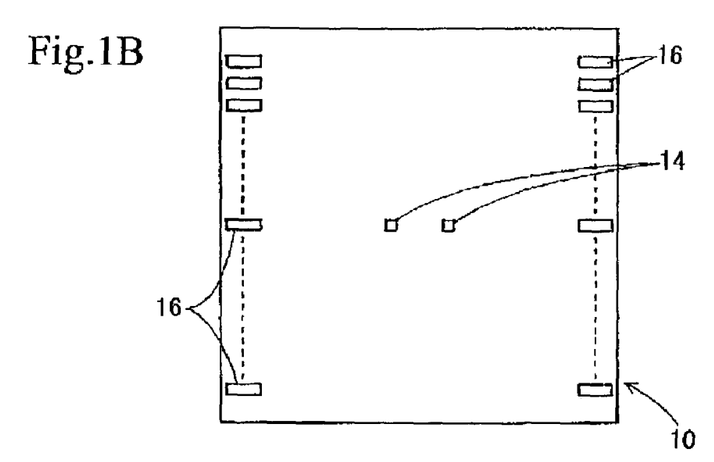
FIG. 1B is a plan view on the back side of the same.
Figure 1C:
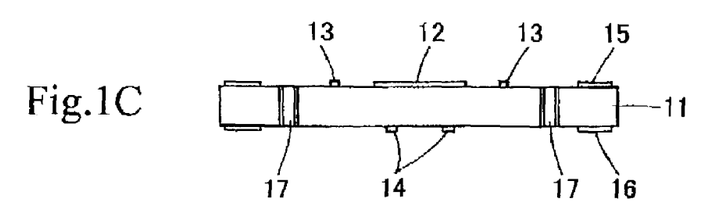
FIG. 1C is a sectional view taken along line X—X of FIG. 1A.
Figure 2A:
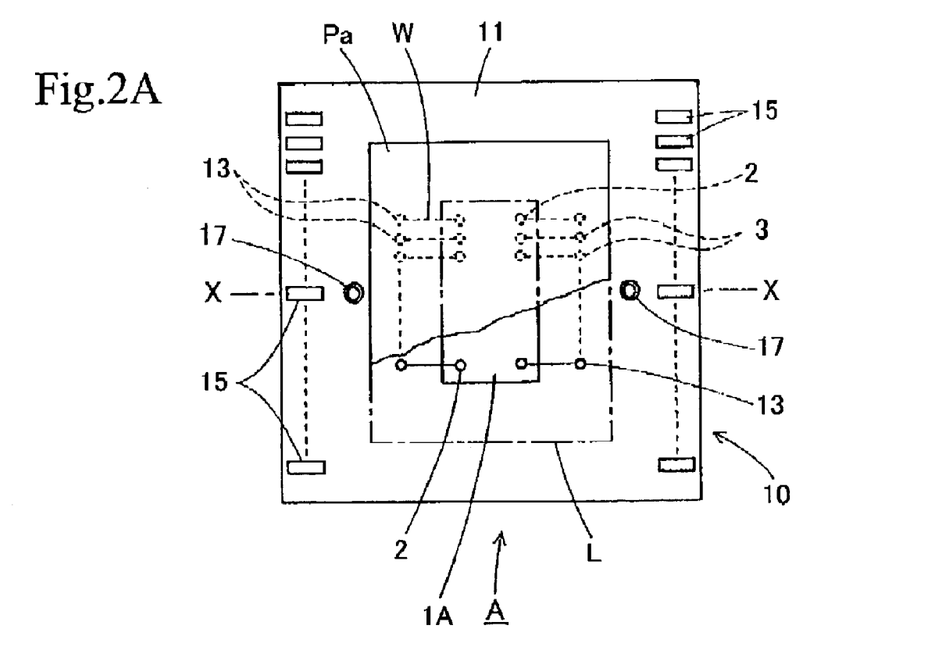
FIG. 2A is a plan view of the same.
Figure 2B:
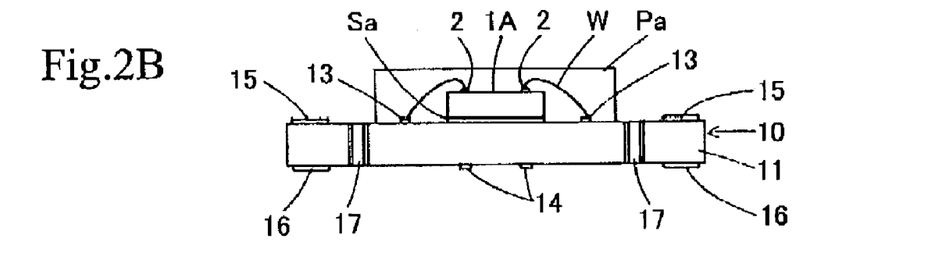
FIG. 2B is a sectional view taken along line X—X of FIG. 2A.
Figure 3:
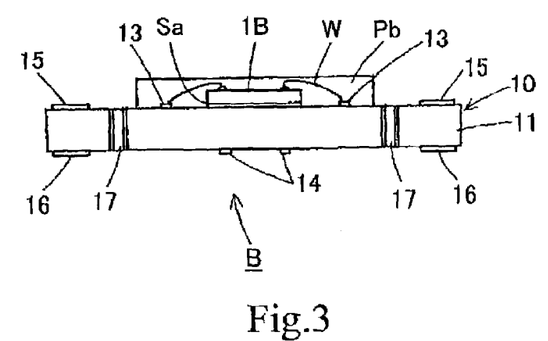
FIG. 3 is a sectional view of the first semiconductor device.
Figure 4:
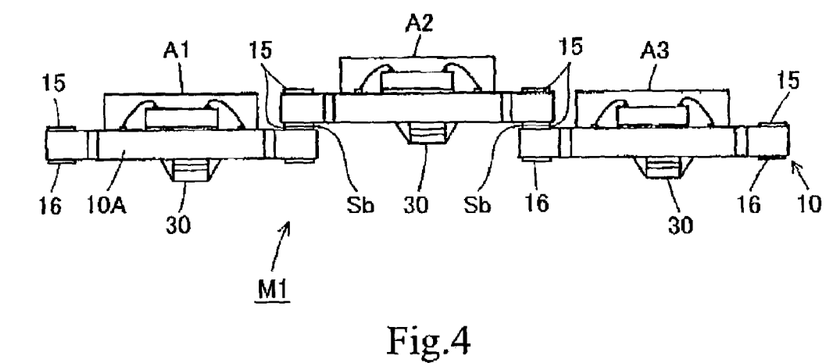
FIG. 4 is a sectional view of a semiconductor module according to a first embodiment of the present invention, constituted by use of a plurality of semiconductor devices shown in FIGS. 2A and 2B.
Figure 5:
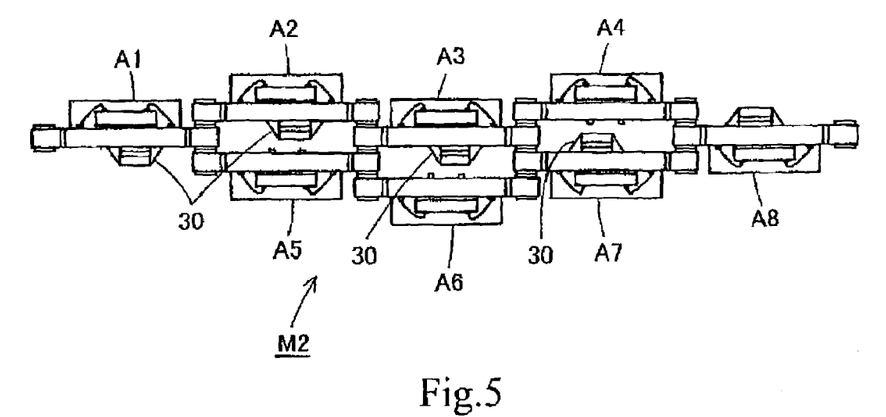
FIG. 5 is a sectional view of a semiconductor module according to a second embodiment.
Figure 6:
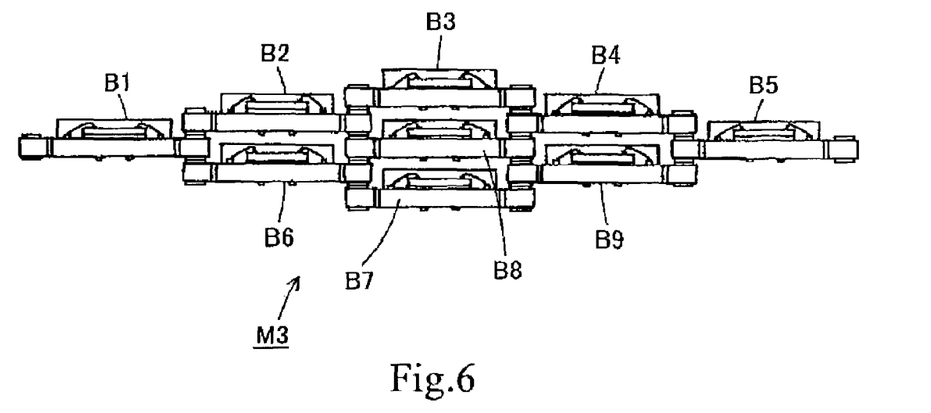
FIG. 6 is a sectional view of a semiconductor module according to a third embodiment of the present invention.
Figure 7:
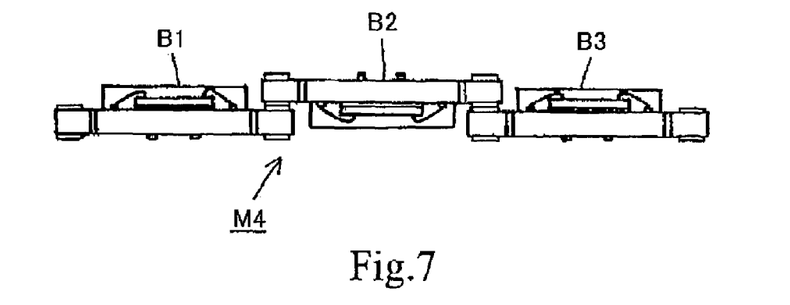
FIG. 7 is a sectional view of a semiconductor module according to a fourth embodiment of the present invention, constituted by use of a plurality of semiconductor devices shown in FIG. 3.
Figure 8A:
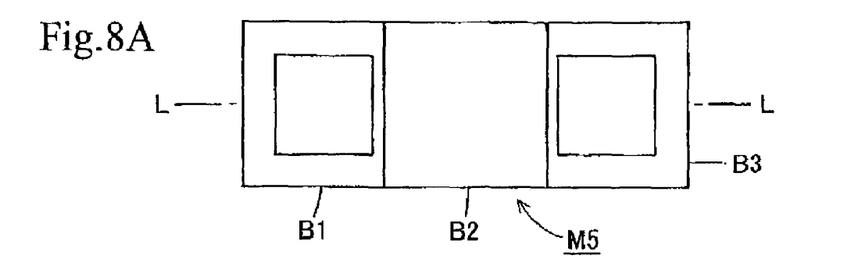
FIG. 8A is a plan view of the same.
Figure 8B:
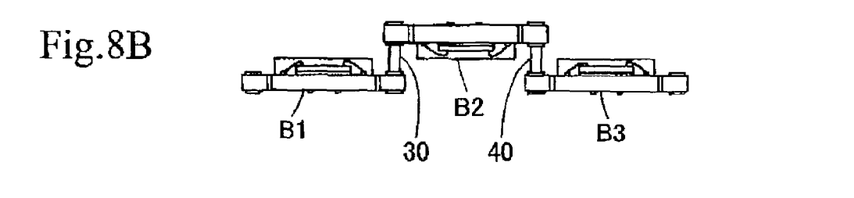
FIG. 8B is a sectional view taken along line L—L of FIG. 8A.
Figure 9:
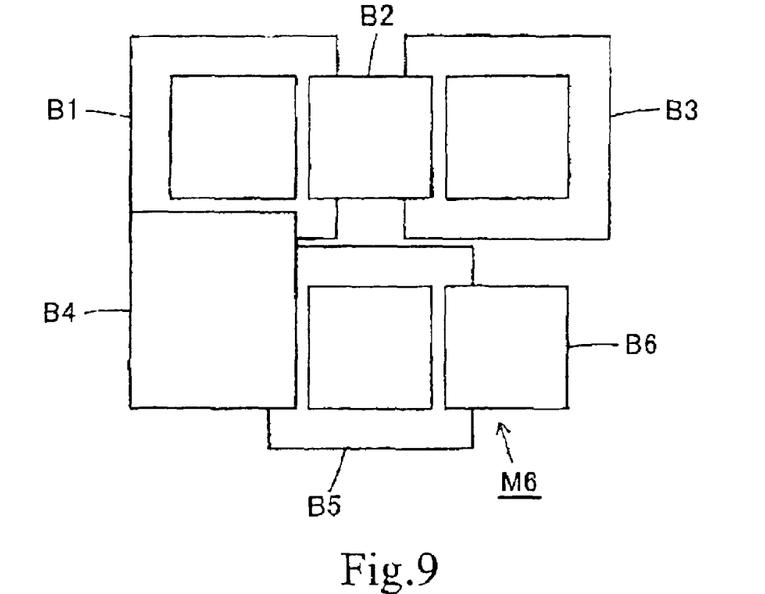
FIG. 9 is a plan view of a semiconductor module according to a sixth embodiment of the present invention.

FIGS. 1A to 1C show a printed wiring board according to an embodiment preferable for use in the semiconductor device of the present invention, in which FIG. 1A is a plan view on the face side of the same, FIG. 1B is a plan view on the back side of the same, and FIG. 1C is a sectional view taken along line X—X of FIG. 1A; FIGS. 2A and 2B show a semiconductor device according to a first embodiment of the present invention, in which FIG. 2A is a plan view of the same, and FIG. 2B is a sectional view taken along line X—X of FIG. 2A; FIG. 3 is a sectional view of a first semiconductor device; FIG. 4 is a sectional view of a semiconductor module according to the first embodiment of the present invention, constituted by use of a plurality of semiconductor devices shown in FIGS. 2A and 2B; FIG. 5 is a sectional view of a semiconductor device according to a second embodiment of the present invention; FIG. 6 is a sectional view of a semiconductor device according to a third embodiment of the present invention; FIG. 7 is a sectional view of a semiconductor module according to a fourth embodiment of the present invention, constituted by use of a plurality of semiconductor devices shown in FIG. 3; FIGS. 8A and 8B show a semiconductor device according to a fifth embodiment of the present invention, in which FIG. 8A is a plan view of the same, and FIG. 8B is a sectional view taken along line L—L of FIG. 8A; and FIG. 9 is a plan view of a semiconductor module according to a sixth embodiment of the present invention.

The same component portions as those of the semiconductor device according to the related art will be denoted by the same symbols as above, in the following description.

First, by use of FIGS. 1A to 1C, the structure of a printed wiring board preferable for use in the semiconductor device according to the present invention will be described.

Symbol 10 denotes the printed wiring board as a whole. The printed wiring board 10 is a single-layer or multi-layer wiring board, including a mount portion 12 for mounting an IC chip on a roughly central portion of the surface of an electrically insulating substrate 11 formed of a glass-epoxy resin or the like, lands 13 arranged in correspondence with a plurality of electrodes of the IC chip to be mounted, provided at both peripheral portions of a longer side of the mount portion 12, and face-side external connection electrodes 15 arranged in correspondence with the lands 13 at both side edges of the insulating substrate 11, which are respectively formed of conductive materials such as copper. In addition, the printed wiring board 10 is provided on its back side with lands 14 for connection of chip parts (described later), and a plurality of back-side external connection electrodes 16 at both side edges of the insulating substrate 11, which are respectively formed of conductive materials such as copper. Besides, as required, at least one via hole 17 is provided, for connection between face-side and back-side wirings or between the face-side and back-side wirings and an intermediate-layer wiring, of the printed wiring board 10. The one-dotted chain line L indicates the range of sealing with a sealing material Pa.

The mount portion 12 must be formed of a conductive material in the case where it is necessary to ground the IC chip to be mounted; where it is unnecessary to ground the IC chip, the mount portion 12 need not be formed of a conductive material. It suffices that the portion for mounting the IC chip thereon can be seen. In addition, the back-side lands 14 are omitted where it is unnecessary to connect the chip parts.

In addition, the vertical positions of the external connection electrodes 15 and 16 may not necessarily be coincident with each other; the external electrodes 15 and 16 may be formed taking into account the number and arrangement corresponding to the functions or the like of the mating printed wiring boards to which the printed wiring board 10 is to be connected.

Furthermore, the printed wiring board 10 shown is drawn as a board for use in a system in which a plurality of electrodes of the IC chip to be mounted are provided in a dual-in-line form. Where the plurality of electrodes are provided along four sides of the IC chip, the lands 13 may be provided along the four sides of the mount portion 12; also, the external connection electrodes 15 and 16 may be provided along the four sides of the printed wiring board 10, or may be provided only along two or three side edges.

Next, by use of FIGS. 2A and 2B, the structure of a semiconductor device according to a first embodiment of the present invention will be described.

In FIGS. 2A and 2B, symbol A denotes the semiconductor device according to the first embodiment of the present invention. The semiconductor device A is comprised of an IC chip 1A (the same as the IC chip 1) and a printed wiring board 10, in the same manner as the semiconductor device C according to the related art. On the surface of the IC chip 1A, a plurality of bumps 2 of gold, solder or the like are provided on the surfaces of electrodes provided in a predetermined arrangement.

The IC chip 1A is adhered and fixed to the mount portion 12 of the printed wiring board 10 shown in FIG. 1A, for example, through a conductive adhesive Sa. The individual bumps 2 are electrically connected to the corresponding lands 13 respectively by metallic thin wires W of gold or the like. The semiconductor device A is also constituted in a structure in which the whole part of the IC chip 1A inclusive of connection portions between the metallic thin wires W and the lands 13 is sealed with an insulating sealing material Pa such as an epoxy resin.

A semiconductor device B according to the second embodiment of the present invention shown in FIG. 3 has a structure in which a printed wiring board 10 having the above-mentioned structure is used, an IC chip 1B smaller in thickness than the IC chip 1A is mounted on a central portion of the printed wiring board 10, and the IC chip 1B inclusive of connection portions between bumps 2 and lands 13 is sealed with a sealing material Pb smaller in thickness than the printed wiring board 10.

In the semiconductor device A and the semiconductor device B thus provided with the external connection electrodes 15 and 16, the external connection electrodes 15 and 16 are provided at outer peripheral portions of the printed wiring board 10, as contrasted to the semiconductor device C according to the related art in which the external connection electrodes 114 are provided on the back side. Therefore, by combining the connections of these external connection electrodes 15 and 16, it is possible to obtain a semiconductor module with predetermined constitution and structure by electrically connecting the semiconductor devices A and/or the semiconductor devices B in a two-dimensional manner or a three-dimensional manner.

As for the size of the semiconductor device A, for example, the thickness of the printed wiring board 10 inclusive of the thicknesses of the external connection electrodes 15 and 16 is about 0.4 mm, the thickness of the sealing material Pa is about 0.6 mm. As for the semiconductor device B, the thickness of the printed wiring board 10 is the same as in the case of the semiconductor device A, and the thickness of the sealing material Pb is about 0.3 mm.

Next, by use of FIGS. 4 to 9, the semiconductor module according to each embodiment of the present invention will be described.

First, referring to FIG. 4, the constitution and structure of the semiconductor module according to the first embodiment of the present invention will be described. The semiconductor module M1 is comprised of three semiconductor devices A1, A2 and A3 (all of them are each the semiconductor device A, and are differentiated by denoting by A1, A2 and A3 for convenience of description), and has a structure in which external connection electrodes 15 of the semiconductor devices A1 and A3 and external connection electrodes 16 of the semiconductor device A2 are electrically connected to each other by solder Sb.

To produce the semiconductor module M1, first, a solder paste (not shown) is preliminarily applied to the external connection electrodes 15 of the semiconductor devices A1 and A3 by the related art such as printing, the semiconductor devices A1 and A3 are mounted at predetermined positions by, for example, a method of mounting them on jigs (not shown), and the external connection electrodes 16 on the back side of the remaining semiconductor device A2 are positioned at and mounted on the external connection electrodes 15 of the semiconductor devices A1 and A3. Thereafter, the solder paste is melted by a method of reflowing or the like, and is then cooled for achieving connection, whereby the semiconductor module M1 is obtained. Chip parts 30 are connected to lands 14 on the back side of the semiconductor devices A1, A2 and A3, as required.

Next, by using FIG. 5, the constitution and structure of the semiconductor module M2 according to the second embodiment of the present invention will be described. The semiconductor module M2 is comprised of eight semiconductor devices A1 to A8 including three chip parts 30. In this semiconductor module, the semiconductor devices A1 to A4 and the semiconductor devices A5 to A8 have a structure in which the external connection electrode 15 on the face side of one semiconductor device is connected to the external connection electrode 16 on the back side of the adjacent semiconductor device, in the same manner as the connection structure of the semiconductor module M1. Namely, the semiconductor devices A2 and A5 have the external connection electrodes 16 on the back side thereof connected to each other through the external connection electrodes 15 and 16 of the semiconductor devices A1 and A3; similarly, the semiconductor devices A3 and A6 have the external connection electrodes 16 on the back side thereof connected to each other through the external connection electrodes 15 and 16 of the semiconductor devices A5 and A7; and the semiconductor devices A4 and A7 have the external connection electrodes 16 on the back side thereof connected to each other through the external connection electrodes 15 and 16 of the semiconductor devices A3 and A8. Chip parts 30 are mounted on the back side of the semiconductor devices A1 to A3 and A7 and A8.

The semiconductor module M3 according to the third embodiment of the present invention shown in FIG. 6 is constituted of nine semiconductor devices B according to the second embodiment. All the semiconductor devices B1 to B9 are connected through the external connection electrodes 15 on the face side and the external connection electrodes 16 on the back side of the adjacent semiconductor devices.

The semiconductor module M3 has a portion where the semiconductor devices B3, B8 and B7 overlapping with each other in a three-layer structure. Where a semiconductor module with a structure in which the semiconductor devices are laminated in such a multi-layer form is needed, it is desirable to use the semiconductor devices B small in thickness.

FIG. 7 shows the semiconductor module M4 according to the fourth embodiment of the present invention. The semiconductor module M4 is constituted of three semiconductor devices B. The semiconductor module M4 has a structure that is preferable where a semiconductor module with a small overall thickness is desired. Namely, the semiconductor devices B1 and B3 are mounted on a mount base (not shown) such as a jig at a predetermined interval, the semiconductor device B2 to be mounted later is inverted face side back, and they are connected by the same soldering method as described above. When the semiconductor module is constituted in such a structure, a semiconductor module having a roughly uniform thickness on the whole is obtained.

FIGS. 8A and 8B show the semiconductor module M5 according to the fifth embodiment of the present invention. The semiconductor module M5 includes three semiconductor devices B1 to B3, wherein the external connection electrodes 15 on the face side of the second semiconductor device B2 are connected to the external connection electrodes 15 on the face side of the semiconductor devices B1 and B3 arranged at a predetermined interval, one through a chip part 30 and the other through a relay board 40.

In the semiconductor module M5 according to this embodiment, as clear from FIG. 8A, the three semiconductor devices B1 to B3 have only their side surfaces in the same direction connected. However, as the semiconductor module M6 according to the sixth embodiment of the present invention shown in FIG. 9, a plurality of semiconductor devices B1, B2, B3 . . . can also be arranged in a connection structure with a two-dimensional expanse, namely, in a two-dimensional connection structure. Besides, when the two-dimensional connection structure is adopted together with a structure in which the semiconductor devices are connected also in the thickness direction as shown in FIGS. 5 and 6, it is possible to constitute a semiconductor module with a connection structure with a three-dimensional expanse.

As has been described above, according to the semiconductor device of the present invention, external connection electrodes are provided on both the face and back sides of outer peripheral portions of printed wiring boards of adjacent semiconductor devices, so that the semiconductor modules of the present invention with a variety of structures can be easily constituted by mutually connecting the external connection electrodes of the adjacent semiconductor devices.

In addition, the semiconductor module according to the present invention adopts a structure in which the printed wiring boards of semiconductor devices are connected to each other either directly or through a chip part or a relay board. Therefore, it is unnecessary to use a mother board occupying a large area, and the semiconductor module can be produced at a much lower cost as compared with the semiconductor module according to the related art. Moreover, a semiconductor can be constituted with two-dimensional and three-dimensional expanses and, if necessary, with a reduced thickness. Thus, the semiconductor module of the present invention has many excellent effects.

What is claimed is:

1. A semiconductor module comprising:

a plurality of semiconductor devices, wherein each semiconductor device has an external connection electrode provided at an outer peripheral portion of at least two opposite edges of a printed wiring board on which a semiconductor integrated circuit chip is mounted, and wherein said external connection electrodes provided on the opposite edges of said printed wiring boards of said plurality of semiconductor devices are electrically connected so that the semiconductor chips mounted on at least two of the plurality of semiconductor devices are in separate vertical planes.

2. A semiconductor module according to claim 1, wherein said external connection electrode provided on the face side of said printed wiring board of one of said semiconductor devices adjacent to each other and said external connection electrode provided on the back side of said printed wiring board of the other of said adjacent semiconductor devices are connected to each other.

3. A semiconductor module according to claim 1, wherein said external connection electrodes provided on the face side or the back side of said printed wiring boards of said semiconductor devices adjacent to each other are connected to each other.

* * * * *